US009552164B2

(12) United States Patent
McCall et al.

(10) Patent No.: US 9,552,164 B2
(45) Date of Patent: Jan. 24, 2017

(54) APPARATUS, METHOD AND SYSTEM FOR DETERMINING REFERENCE VOLTAGES FOR A MEMORY

(71) Applicant: Intel Corporation, Santa Clara, CA (US)

(72) Inventors: James A. McCall, Portland, OR (US); Kuljit S. Bains, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/440,066

(22) PCT Filed: Nov. 22, 2013

(86) PCT No.: PCT/US2013/071532
§ 371 (c)(1),
(2) Date: Apr. 30, 2015

(87) PCT Pub. No.: WO2014/085266
PCT Pub. Date: Jun. 5, 2014

(65) Prior Publication Data
US 2015/0309726 A1  Oct. 29, 2015

Related U.S. Application Data

(60) Provisional application No. 61/731,906, filed on Nov. 30, 2012.

(51) Int. Cl.
*G06F 3/00* (2006.01)
*G06F 3/06* (2006.01)
(Continued)

(52) U.S. Cl.
CPC ............ *G06F 3/061* (2013.01); *G06F 3/0659* (2013.01); *G06F 3/0673* (2013.01); *G11C 5/147* (2013.01);
(Continued)

(58) Field of Classification Search
CPC ...... G06F 3/061; G06F 3/0673; G06F 3/0659; G11C 29/021; G11C 29/028; G11C 5/147; G11C 7/1084; G11C 7/1057
See application file for complete search history.

(56) References Cited

U.S. PATENT DOCUMENTS 5,572,415 A * 11/1996 Mohan ..................... G05F 3/24
363/126
6,339,357 B1 * 1/2002 Yamasaki .............. G11C 5/147
327/407

(Continued)

OTHER PUBLICATIONS

"Design How-To Powering DDR memory and SSTL logic", by Peter James Miller, Texas Instruments, May 24, 2011,attracted from http://www.eetimes.com/documentasp?doc_id=1278797 &print=yes.*

(Continued)

*Primary Examiner* — Jing-Yih Shyu
(74) *Attorney, Agent, or Firm* — Blakely, Sokoloff, Taylor & Zafman LLP

(57) ABSTRACT

Techniques and mechanisms for a memory device to concurrently receive and process signals each based on a different respective reference voltage level. In an embodiment, an input/output (I/O) interface of a memory device includes receiver circuits each to process a respective signal received via a corresponding signal line of a bus. In response to one or more configuration commands, a first receiver circuit is configured to process a first signal based on a first reference voltage level and a second receiver circuit is configured to process a second signal based on a second reference voltage level. In another embodiment, a memory controller sends the one or more configuration commands to such a memory device based on an evaluation of voltage swing characteristics each corresponding to a different respective signal line of a bus.

23 Claims, 9 Drawing Sheets

(51) Int. Cl.
  *G11C 7/10*   (2006.01)
  *G11C 5/14*   (2006.01)
  *G11C 29/02*  (2006.01)

(52) U.S. Cl.
  CPC .......... *G11C 7/1057* (2013.01); *G11C 7/1084* (2013.01); *G11C 29/021* (2013.01); *G11C 29/028* (2013.01)

(56) References Cited

U.S. PATENT DOCUMENTS

| | | | |
|---|---|---|---|
| 8,255,772 B1* | 8/2012 | Foley | G11C 29/028 714/718 |
| 2001/0004126 A1* | 6/2001 | Ohlhoff | G11O 5/147 257/528 |
| 2002/0005735 A1* | 1/2002 | Goetting | H03K 19/00361 326/39 |
| 2004/0070409 A1* | 4/2004 | Mobley | H04L 25/063 324/672 |
| 2006/0129728 A1 | 6/2006 | Hampel | |
| 2006/0142977 A1* | 6/2006 | Oh | G11C 5/147 702/190 |
| 2007/0118711 A1 | 5/2007 | Donnelly et al. | |
| 2010/0268906 A1* | 10/2010 | Gillingham | G06F 13/1689 711/167 |
| 2012/0246396 A1 | 9/2012 | Roohparvar | |
| 2013/0003475 A1* | 1/2013 | Jenkins | G11C 7/1072 365/193 |
| 2013/0147545 A1* | 6/2013 | Kim | G11C 29/12005 327/541 |

OTHER PUBLICATIONS

"PCT, International Search Report and Written Opinion of the International Searching Authority for International Application No. PCT/US2013/071532", (Mar. 12, 2014), Whole Document.
International Preliminary Report on Patentability dated Jun. 11, 2015, in International Patent Application No. PCT/US2013/071532, 8 pages.
Office Action for Korean Patent Application No. 10-2015-7009834, mailed Apr. 12, 2016, 4 pgs.

* cited by examiner

200

210

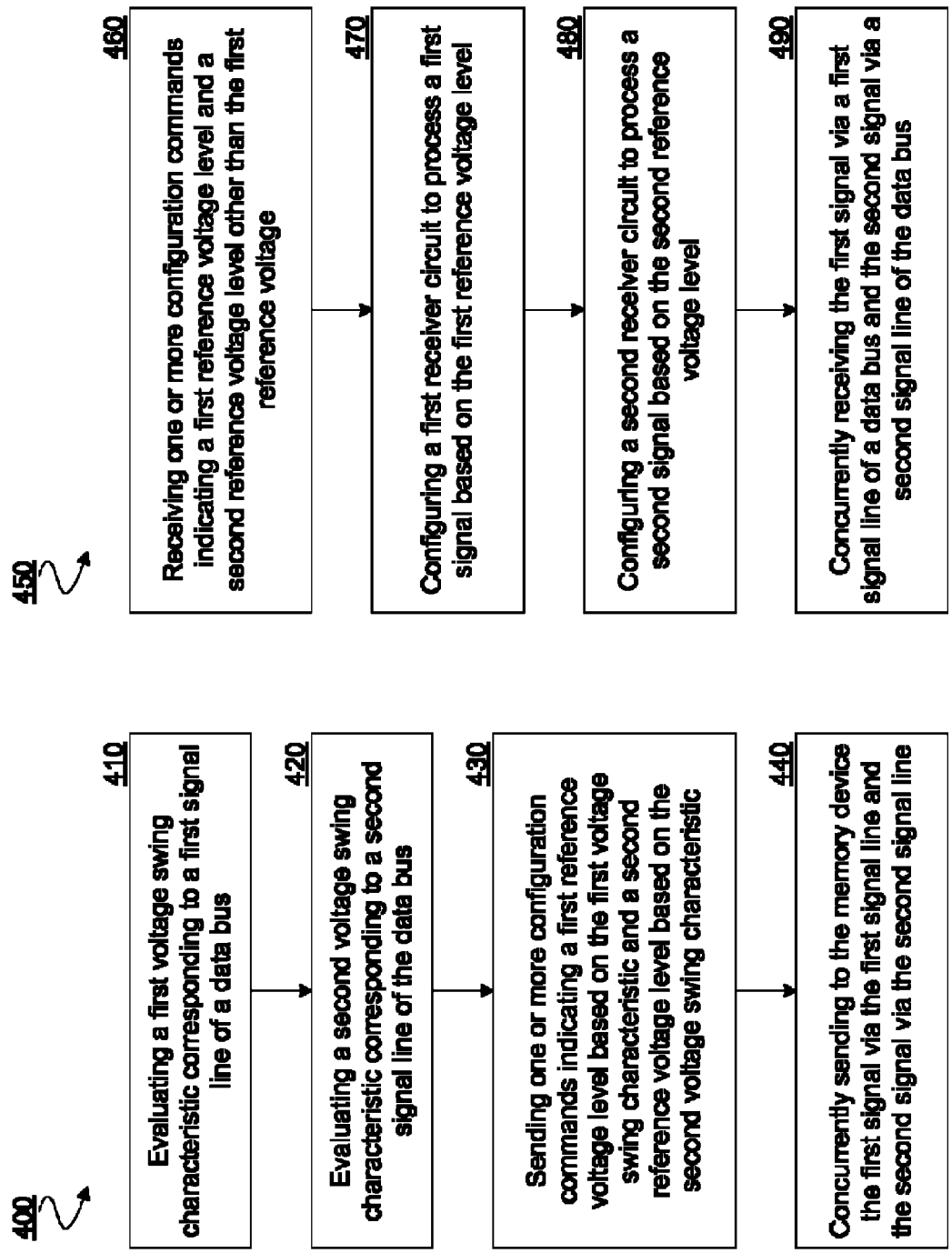

FIG. 7

Table 700

| A6 | Vref Range |
|----|-----------|
| 0  | Range 1   |
| 1  | Range 2   |

Table 710

| A5..A0 | Range 1 | Range 2 | A5..A0 | Range 1 | Range 2 |
|--------|---------|---------|--------|---------|---------|
| 00 0000 | 60.00% | 45.00% | 01 1010 | 76.90% | 61.90% |
| 00 0001 | 60.65% | 45.65% | 01 1011 | 77.55% | 62.55% |
| 00 0010 | 61.30% | 46.30% | 01 1100 | 78.20% | 63.20% |
| 00 0011 | 61.95% | 46.95% | 01 1101 | 78.85% | 63.85% |
| 00 0100 | 62.60% | 47.60% | 01 1110 | 79.50% | 64.50% |
| 00 0101 | 63.25% | 48.25% | 01 1111 | 80.15% | 65.15% |
| 00 0110 | 63.90% | 48.90% | 10 0000 | 80.80% | 65.80% |
| 00 0111 | 64.55% | 49.55% | 10 0001 | 81.45% | 66.45% |
| 00 1000 | 65.20% | 50.20% | 10 0010 | 82.10% | 67.10% |
| 00 1001 | 65.85% | 50.85% | 10 0011 | 82.75% | 67.75% |
| 00 1010 | 66.50% | 51.50% | 10 0100 | 83.40% | 68.40% |
| 00 1011 | 67.15% | 52.15% | 10 0101 | 84.05% | 69.05% |
| 00 1100 | 67.80% | 52.80% | 10 0110 | 84.70% | 69.70% |
| 00 1101 | 68.45% | 53.45% | 10 0111 | 85.35% | 70.35% |
| 00 1110 | 69.10% | 54.10% | 10 1000 | 86.00% | 71.00% |
| 00 1111 | 69.75% | 54.75% | 10 1001 | 86.65% | 71.65% |
| 01 0000 | 70.40% | 55.40% | 10 1010 | 87.30% | 72.30% |
| 01 0001 | 71.05% | 56.05% | 10 1011 | 87.95% | 72.95% |
| 01 0010 | 71.70% | 56.70% | 10 1100 | 88.60% | 73.60% |
| 01 0011 | 72.35% | 57.35% | 10 1101 | 89.25% | 74.25% |
| 01 0100 | 73.00% | 58.00% | 10 1110 | 89.90% | 74.90% |
| 01 0101 | 73.65% | 58.65% | 10 1111 | 90.55% | 75.55% |
| 01 0110 | 74.30% | 59.30% | 11 0000 | 91.20% | 76.20% |
| 01 0111 | 74.95% | 59.95% | 11 0001 | 91.85% | 76.85% |
| 01 1000 | 75.60% | 60.60% | 11 0010 | 92.50% | 77.50% |
| 01 1001 | 76.25% | 61.25% | 11 0011 to 11 1111 | Reserved | Reserved |

APPARATUS, METHOD AND SYSTEM FOR DETERMINING REFERENCE VOLTAGES FOR A MEMORY

CROSS-REFERENCE TO RELATED APPLICATIONS

This application is a U.S. National Phase of International Patent Application No. PCT/US2013/071532, filed Nov. 22, 2013, entitled "APPARATUS, METHOD AND SYSTEM FOR DETERMINING REFERENCE VOLTAGES FOR A MEMORY," which claims the benefit of priority from U.S. Provisional Patent Application No. 61/731,906, filed Nov. 30, 2012, which applications are incorporated herein by reference in their entireties.

BACKGROUND

1. Technical Field

Embodiments of the invention are generally related to memory systems, and more particularly, but not exclusively, to the configuring of reference voltages for a memory device.

2. Background Art

Integrated circuit technologies continue to evolve. Computing and communications designs are incorporating more functionality, higher processing and transmission speeds, smaller feature sizes, more memory, etc., into smaller and more robust architectures. Semiconductor memories in particular are evolving at a rapid pace. Memory devices have reduced power requirements, increased capacities, increased operating frequencies, reduced latencies, etc., all while ramping with the exponential density increases according to Moore's Law.

To reduce power or otherwise scale performance, double-data-rate (LPDDR 4), cross point memory, phase change memory (PCM) and other memory technologies are incorporating various features such as alternative termination schemes. Such schemes, which can include VDDQ or VSSQ termination, typically provide for relatively simple memory management for power efficiency under various usage models. However, these termination schemes tend to come at the expense of other performance considerations such as receive-side management of I/O signal errors. One cause of this is the susceptibility of such termination to the effects of variation in integrated circuit fabrication processing which, in turn, can reduce signaling performance. This is one reason for the growing need to provide improved techniques and mechanisms for memory systems to account for signal variation.

BRIEF DESCRIPTION OF THE DRAWINGS

The various embodiments of the present invention are illustrated by way of example, and not by way of limitation, in the figures of the accompanying drawings and in which:

FIG. 4A is a flow diagram illustrating elements of a method for controlling a memory device according to an embodiment.

FIG. 4B is a flow diagram illustrating elements of a method for configuring multiple reference voltages according to an embodiment.

FIG. 7 illustrates tables of mode register values for identifying reference voltage levels according to an embodiment.

DETAILED DESCRIPTION

Embodiments discussed herein variously provide techniques and mechanisms for operation of a memory device based on different reference voltage levels. As used herein, "reference voltage level" (or for brevity, simply "reference voltage" or "Vref") refers to a level of voltage which is to serve as a threshold for distinguishing whether a given signal represents a first logic state or a second logic state. Certain embodiments variously provide high granularity control for reference voltage levels—e.g. including control at the level of individual I/O circuits of a memory device, the I/O circuits each corresponding to a different respective signal line of a bus. Certain embodiments are discussed herein in the context of configuring reference voltage levels for processing signals received via different respective signal lines of a data bus. However, such discussion may be extended to additionally or alternatively apply to configuring reference voltage levels for processing signals received via any of various sets of signal lines.

Figure 1:
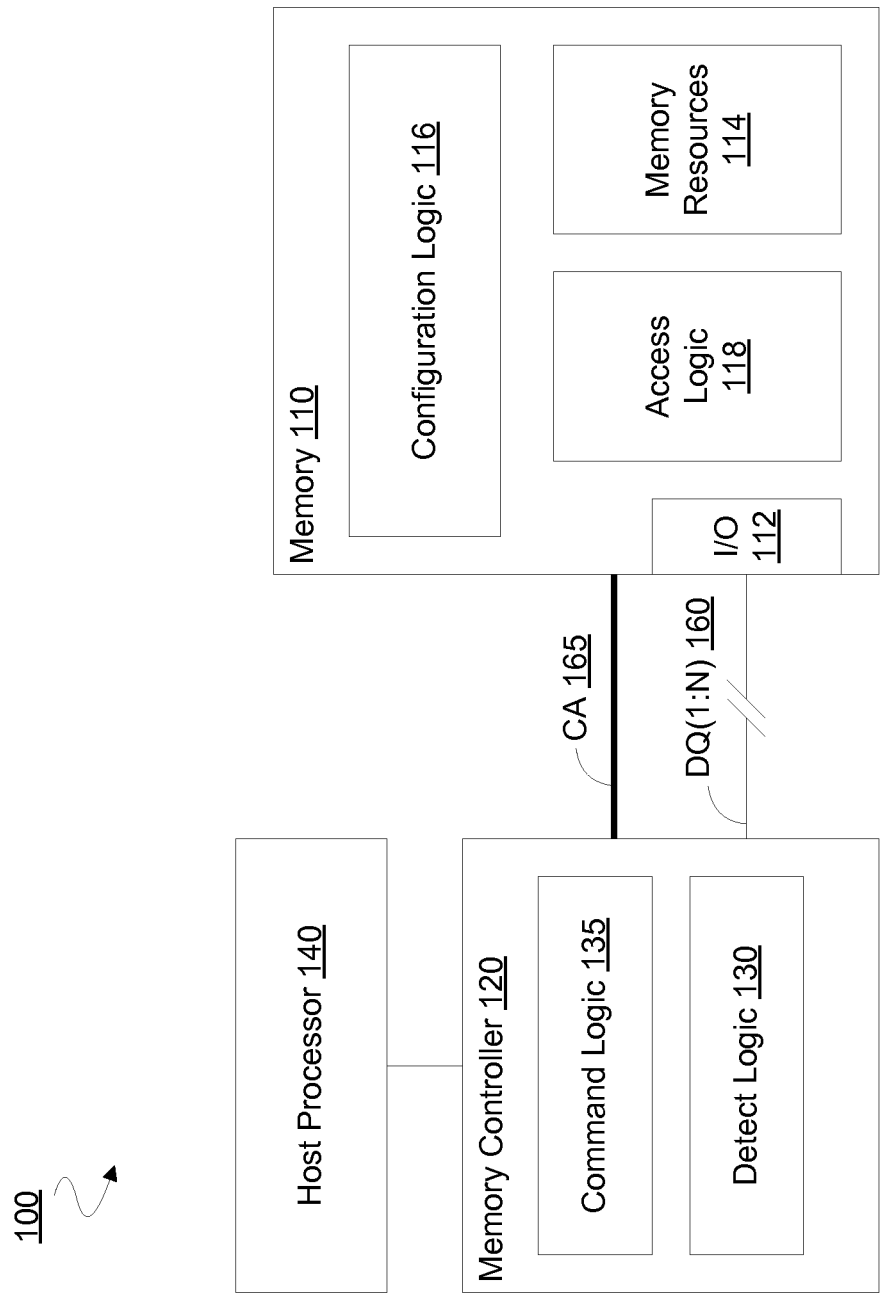
FIG. 1 is a block diagram illustrating elements of a platform for operating a memory according to an embodiment.

FIG. 1 illustrates elements of a system 100 for providing a plurality of reference voltages according to an embodiment. System 100 may include memory device 110 coupled to memory controller 120—e.g. where memory controller 120 is to provide access to memory device 110 for a host processor 140 which is included in or coupled to system 100.

Memory device 110 may include any of a variety of types of memory technology that, for example, have rows of memory cells, where data is accessible via a wordline or the equivalent. In one embodiment, memory device 110 includes dynamic random access memory (DRAM) technology. Memory device 110 may be an integrated circuit package within a larger memory device (not shown) of system 100. For example, memory device 110 may be a DRAM device of a memory module such as a dual in-line memory module (DIMM).

Memory device 110 may include memory resources 114, which represents one or more logical and/or physical groups of memory. An example of one such grouping of memory is a bank of memory resources which, for example, may include an array of storage elements arranged in rows and columns. Memory device 110 may include access logic 118 to facilitate, at least in part, access to memory resources 114—e.g. where such access is provided for servicing one or more commands from memory controller 120. Access logic 118 may include, or operate in conjunction with, logic of memory device 110 which provides resource access according to conventional techniques—e.g. where functionality of input/output (I/O) circuitry 112 and/or access logic 118 supplements such conventional techniques with additional functionality discussed herein. By way of illustration and not limitation, access logic 118 may include or couple to column logic and/or row logic (not shown) which are used to decode an access instruction to the proper memory location within memory resources 114.

Memory controller 120 may send commands or instructions to memory device 110 over a one or more buses, as represented by the illustrative command/address (CA) bus 165. Such commands may be interpreted by memory device 110—e.g. including memory device 110 decoding command information to perform a variety of access functions within the memory and/or decoding address information with column logic and/or row logic. For example, such logic may access a specific location in memory resources 114 with a combination of a column address strobe or signal (CAS) and a row address strobe or signal (RAS). Rows of memory may be implemented in accordance with known memory architectures or their derivatives. Briefly, a row of memory resources 114 may include one or more addressable columns of memory cells, as identified by the CAS generated by column logic of memory device 110. The rows may each be variously addressable via the RAS generated by row logic of memory 110.

Access to memory resources 114 may be for the purpose of writing data exchanged—and/or reading data to be exchanged—via a data bus coupled to I/O circuitry 112 of memory device 110. For example, N data bus signal lines DQ(1:N) 160 may couple I/O circuitry 112 to memory controller 120 and/or one or more other memory devices (not shown).

In an embodiment, I/O circuitry 112 operates to process signals received via DQ(1:N) 160—e.g. to variously identify such signals as representing any of a plurality of logical states—e.g. the plurality including a logic high ("1") state and a logic low ("0") state. Such processing may be based on reference voltages which are each to serve as a respective basis for variously distinguishing voltages which are to correspond to a logic high state from other voltages which are to correspond to a logic low state.

Memory device 110 may include configuration logic 116 to determine a first reference voltage level for processing a signal received via at least one of signal lines DQ(1:N) 160 and a second reference voltage level—different from the first reference voltage level—for processing a signal received via at least one other of signal lines DQ(1:N) 160. For example, memory controller 120 may include detect logic 130 to evaluate respective voltage swing characteristics for some or all of DQ(1:N) 160. Based on such evaluation, command logic 135 of memory controller 120 may communicate—e.g. via CA 165—information specifying or otherwise indicating to configuration logic 116 multiple reference voltage levels to be used each for a different respective one or more of DQ(1:N) 160. In response, configuration logic 116 may provide or otherwise indicate to I/O circuitry 112 the reference voltage levels to be used for processing signals received via different respective ones of DQ(1:N) 160.

Figure 2A:
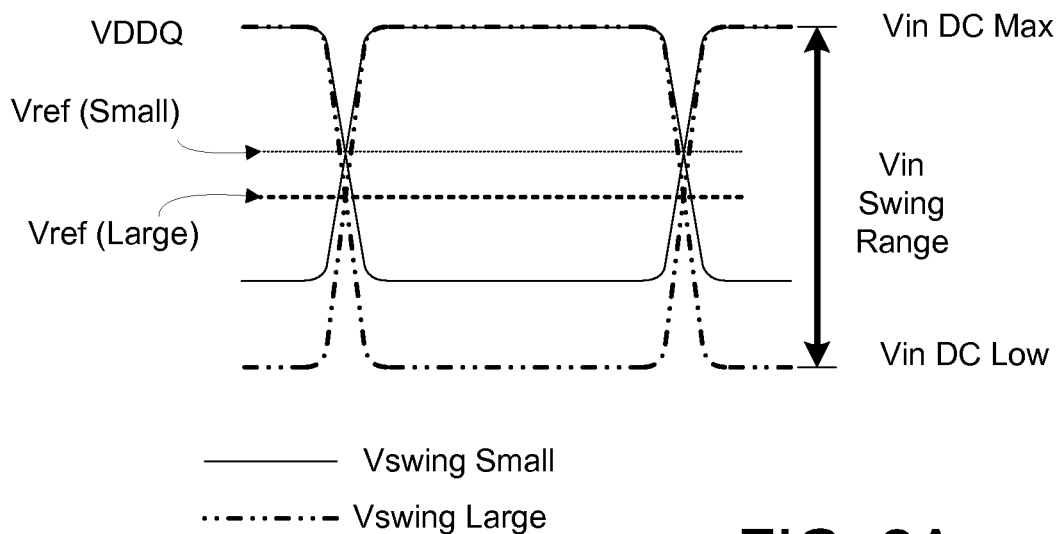
FIG. 2A is a timing diagram illustrating elements of reference voltages to be variously determined according to an embodiment.

FIG. 2A shows a timing diagram 200 for signals such as those received via I/O circuitry 112. Timing diagram 200 illustrates one example of voltage level variation which may be addressed according to techniques discussed herein. More particularly, timing diagram 200 shows one signal which exhibits a relatively large voltage swing between levels Vin DC max and VinDC low, and a second signal which exhibits a relatively small voltage swing between Vin DC max and another voltage level which is higher than VinDC low. The two signals may be received by I/O circuitry 112 (for example) via different signal lines of the same bus—e.g. the same data bus—at the same time. Alternatively, the two signals may be received via the same signal line of a bus at different times. Although certain embodiments are not limited in this regard, the voltage variation illustrated in timing diagram 200 may result from IC fabrication process variation which, for example, includes variation in on-die termination (ODT) or other signal circuitry characteristics.

Timing diagram 200 also illustrates an effective reference voltage value Vref small and an effective reference voltage value Vref large each for a different respective one of the two signals. Vref small and Vref large may serve as different reference values to variously distinguish logic low states from logic high states, each for their corresponding signals.

Figure 2B:
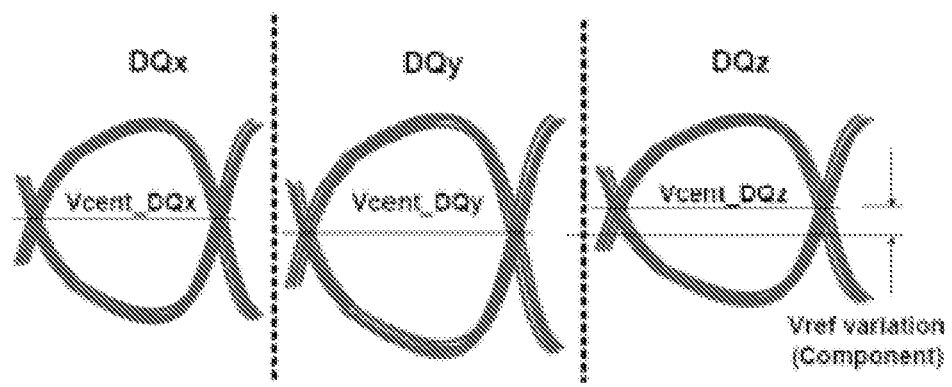
FIG. 2B is a eye diagram illustrating elements of reference voltage variation to be accommodated according to an embodiment.

FIG. 2B shows an eye diagram 210 which illustrates, for different signal lines DQx, DQy, DQz of the same data bus, respective center voltages Vcent_DQx, Vcent_DQy, Vcent_DQz. Certain embodiments are based on a recognition of variation between center voltages Vcent_DQx, Vcent_DQy, Vcent_DQz, and that memory device performance may be improved by providing different Vref levels for respective signals received via signal lines DQx, DQy, DQz.

Figure 3:
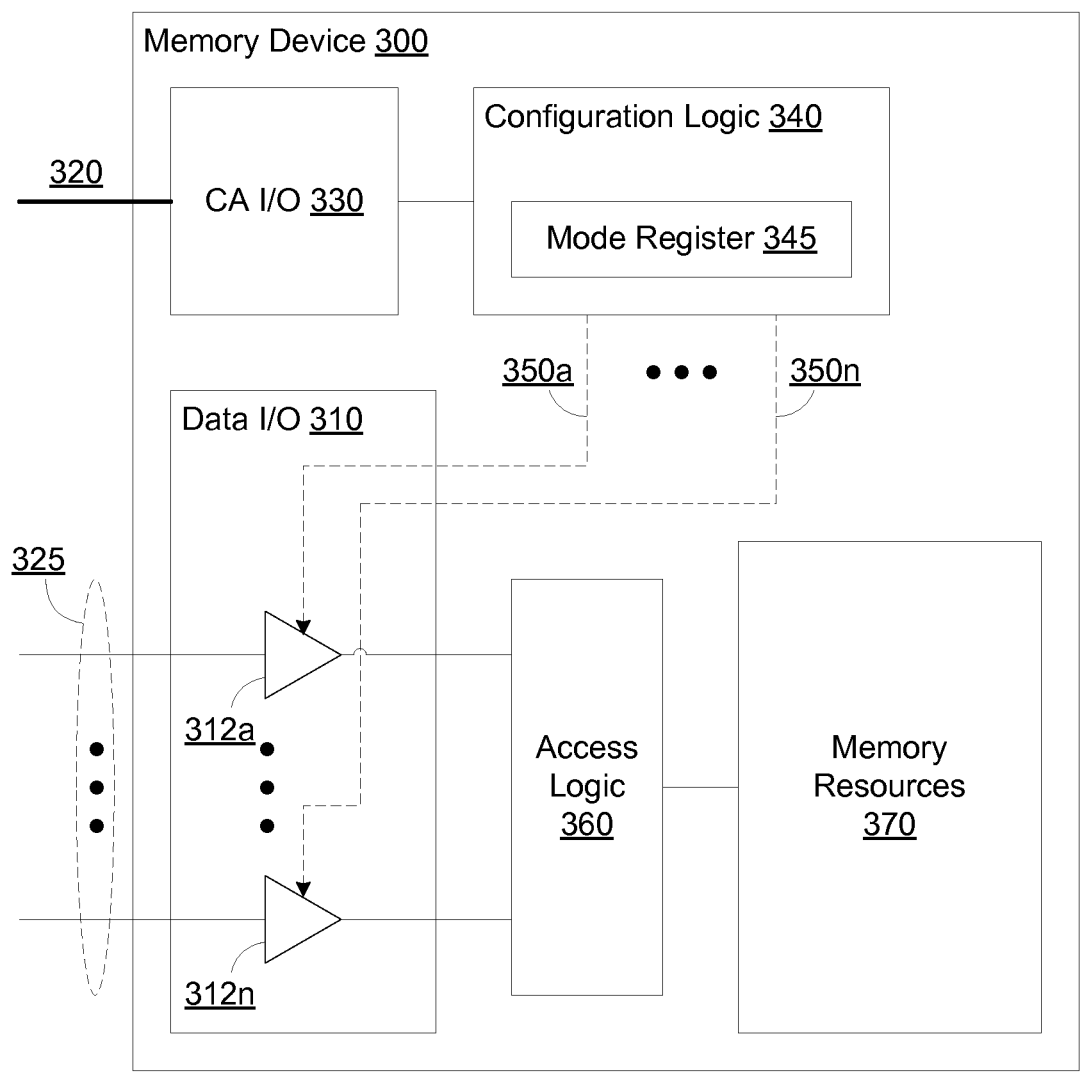
FIG. 3 is a block diagram illustrating elements of a memory device to be configured for different reference voltages according to an embodiment.

FIG. 3 illustrates elements of a memory device 300 for providing multiple reference voltages according to an embodiment. Memory device 300 may operate in conjunction with a memory controller such as memory controller 120. For example, memory device 300 may include one or more features of memory device 110. Although certain embodiments are not limited in this regard, memory device 300 may support LPDDR 4 and/or any of a variety of standards for double-data-rate standard memory operation.

In an embodiment, memory device 300 includes access logic 360 and memory resources 370 which, for example, provide some or all of the respective functionality of access logic 118 and memory resources 114. Memory device 300 may further comprise command/address (CA) I/O 330 and data I/O 310 to couple memory device 300, respectively, to a command address bus 320 and a data bus 325. Data I/O 310 may include some or all of the features of I/O circuitry 112, for example. In some embodiments, CA I/O 330 and data I/O 310 are incorporated into the same I/O interface.

As discussed herein with respect to I/O circuitry 112, data I/O 310 may receive signals via different respective signal lines of data bus 325. Processing of such received signals may include data I/O 310 variously identifying the signals as representing either of a logic high state and a logic low state. In an embodiment, such identification may be based on reference voltage levels each for a different respective one or more different signal lines of data bus 325.

By way of illustration and not limitation, data I/O 310 may include a plurality of receiver circuits 312a, . . . , 312n which are each coupled to a different respective signal line of data bus 325. In an embodiment, the plurality of receiver circuits 312a, . . . , 312n includes at least two receiver circuits—e.g. the illustrative receiver circuits 312a, 312n—which concurrently process different data bus signals based on different reference voltage levels.

For example, memory device 300 may include configuration logic 340 (such as configuration logic 116) which provides signals 350a, . . . , 350n each to a respective one of the plurality of receiver circuits 312a, . . . , 312n. Signals 350a, . . . , 350n may each include or otherwise indicate a respective reference voltage level. In response to signals 350a, . . . , 350n, different ones of the plurality of receiver circuits 312a, . . . , 312n may be variously configured each based on a respective reference voltage level. By way of illustration and not limitation, receiver circuit 312a and receiver circuit 312n may be variously configured each based on a different respective one of Vref small and Vref large of timing diagram 200.

In an embodiment, configuration logic 340 provides signals 350a, . . . , 350n based on information from a memory controller (not shown) coupled to memory device 300. For example, configuration logic 340 may include or couple to one or more mode registers—e.g. including the illustrative mode register 345—which are to store information which specifies or otherwise indicates configuration state for memory device 300. The memory controller may write to such one or more mode registers to cause configuration logic 340 identify different reference voltage levels and to variously configure such reference voltage levels each for at least a respective one of receiver circuits 312a, . . . , 312n.

FIG. 4A illustrates elements of a method 400 for controlling a memory device according to an embodiment. Method 400 may be performed by a memory controller having some or all of the functionality of memory controller 120. For example, method 400 may be performed to configure a memory device having one or more features of memory device 110 and/or memory device 300.

Method 400 may include, at 410, evaluating a first voltage swing characteristic corresponding to a first signal line of a data bus. Method 400 may further include, at 420, evaluating a second voltage swing characteristic corresponding to a second signal line of the data bus. For example, the evaluating at 410 (or the evaluating at 420) may include exchanging one or more test signals with a memory device via the first signal line (or second signal line) and, based thereon, detecting a high voltage level of a test signal, a low voltage level of a test signal, a total voltage swing of a test signal and/or the like. In an embodiment, the evaluating at 410 (or the evaluating at 420) may be adapted from conventional techniques for determining a reference voltage level to use for all signal lines of a data bus—e.g. where such techniques are modified to determine a reference voltage level for only one signal line or some other subset of signal lines of a data bus.

Method 400 may further comprise, at 430, sending one or more configuration commands indicating a first reference voltage level based on the first voltage swing characteristic and a second reference voltage level based on the second voltage swing characteristic. For example, the one or more configuration commands may be sent from the memory controller performing method 400 to a memory device to be configured based on multiple reference voltage levels.

In response to the one or more commands sent at 430, such a memory device may be configured to process a first signal based on the first reference voltage level. The memory device may be further configured based on the one or more commands to process a second signal based on the second reference voltage level. Such configuration may include, for example, some or all of the features discussed herein with respect to variously configuring multiple ones of receiver circuits 312a, . . . , 312n. Method 400 may further comprise, at 440, the memory controller concurrently sending to the memory device the first signal via the first signal line and the second signal via the second signal line.

FIG. 4B illustrates elements of a method 450 for operating a memory device according to an embodiment. In an embodiment, method 450 may be performed by a memory device having some or all of the functionality of memory device 110 and/or memory device 300.

Method 450 may include, at 460, receiving one or more configuration commands indicating a first reference voltage level and a second reference voltage level other than the first reference voltage level. The one or more configuration commands may be received at 460 from a memory controller coupled to the memory device—e.g. via CA bus 165. For example, the one or more configuration commands may correspond to those sent at 430 in method 400.

In response to the one or more configuration commands, method 450 may further perform, at 470, configuring a first receiver circuit to process a first signal based on the first reference voltage level. At 480, method 450 may further perform, in response to the one or more configuration commands, configuring a second receiver circuit of the I/O interface to process a second signal based on the second reference voltage level. The configuring at 470 and/or 480 may include, for example, some or all of the features discussed herein with respect to variously configuring multiple ones of receiver circuits 312a, . . . , 312n.

In an embodiment, method 450 further comprises, at 490, concurrently receiving the first signal and the second signal at the I/O interface, wherein the first signal is received via a first signal line of a data bus and the second signal is received via a second signal line of the data bus. The first signal and second signal received at 490 may be processed, respectively, by the first receiver circuit configured based on the first reference voltage level and by the second receiver circuit configured based on the second reference voltage level.

Figure 5A:
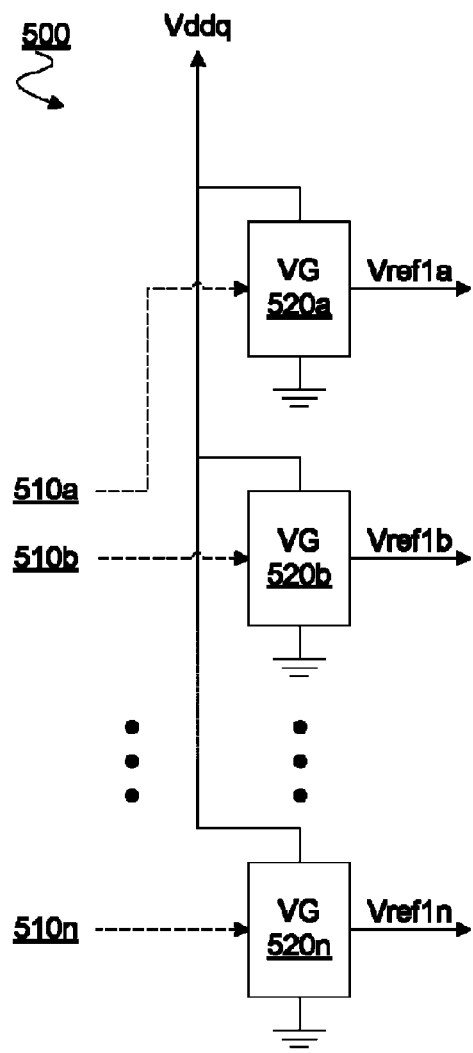
FIGS. 5A and 5B are block diagrams illustrating elements of circuitry according to respective embodiments for variously implementing different reference voltages.

FIG. 5A illustrates elements of voltage generation circuitry 500 of a memory device according to an embodiment. Voltage generation circuitry 500 may be included in or coupled to I/O circuitry having some or all of the features of I/O circuitry 112 and/or data I/O 310, for example. In an embodiment, voltage generation circuitry is configured to provide various reference voltage levels each to a different respective one or more receiver circuits of such I/O circuitry.

By way of illustration and not limitation, voltage generation circuitry 500 may include a plurality of circuits—represented by the illustrative VG circuits 520a, 520b, . . . , 520n—which are each coupled to a supply voltage such as Vddq. The various VG circuits 520a, 520b, . . . , 520n may operate independent of one another, each in response to a respective one of control signals 510a, 510b, . . . , 510n indicating different reference voltage levels. In an embodiment, control signals 510a, 510b, . . . , 510n—which may include some or all of the features of signals 350a, . . . , 350n for example—each tune, adjust or otherwise configure a corresponding one of VG circuits 520a, 520b, . . . , 520n. Based on such configuration, VG circuits 520a, 520b, . . . , 520n may output, respectively, reference voltage levels Vref1a, Vref1b, . . . , Vref1n which include two or more different voltage levels. Accordingly, voltage generation circuitry 500 may facilitate bit-level granular—e.g. per-bit specific—Vref control.

Figure 5B:
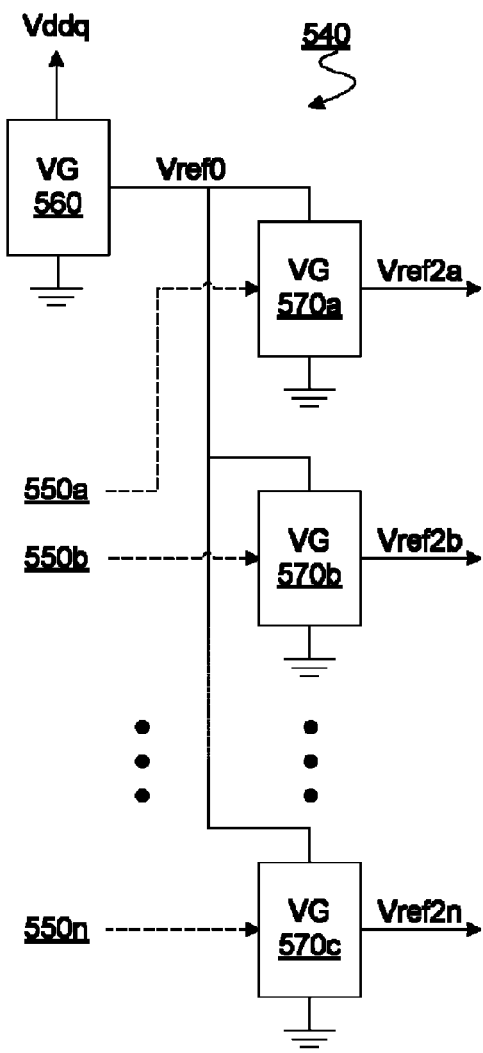

FIG. 5B illustrates elements of voltage generation circuitry 540 of a memory device according to another embodiment. Voltage generation circuitry 540 may include VG circuits 570a, 570b, . . . , 570n to provide reference voltage levels Vref2a, Vref2b, . . . , Vref2n based on control signals 550a, 550b, . . . , 550n—e.g. in a manner similar to the providing of reference voltage levels Vref1a, Vref1b, . . . , Vref1n by VG circuits 520a, 520b, . . . , 520n of voltage generation circuitry 500. However, in voltage generation circuitry 540, VG circuits 570a, 570b, . . . , 570n are coupled to the same supply voltage—in this example, Vddq—via another VG circuit 560. In an embodiment, VG circuit 560 outputs a baseline reference voltage level Vref0 to each of VG circuits 570a, 570b, . . . , 570n, which each apply a respective trim (i.e. a marginal voltage variation) to variously generate a respective one of reference voltage levels Vref2a, Vref2b, . . . , Vref2n. For example, a memory controller in one embodiment may communicate to the memory device per-bit Vref control signals which specify reference voltage trim control values for different data bus signal lines.

Figure 6:
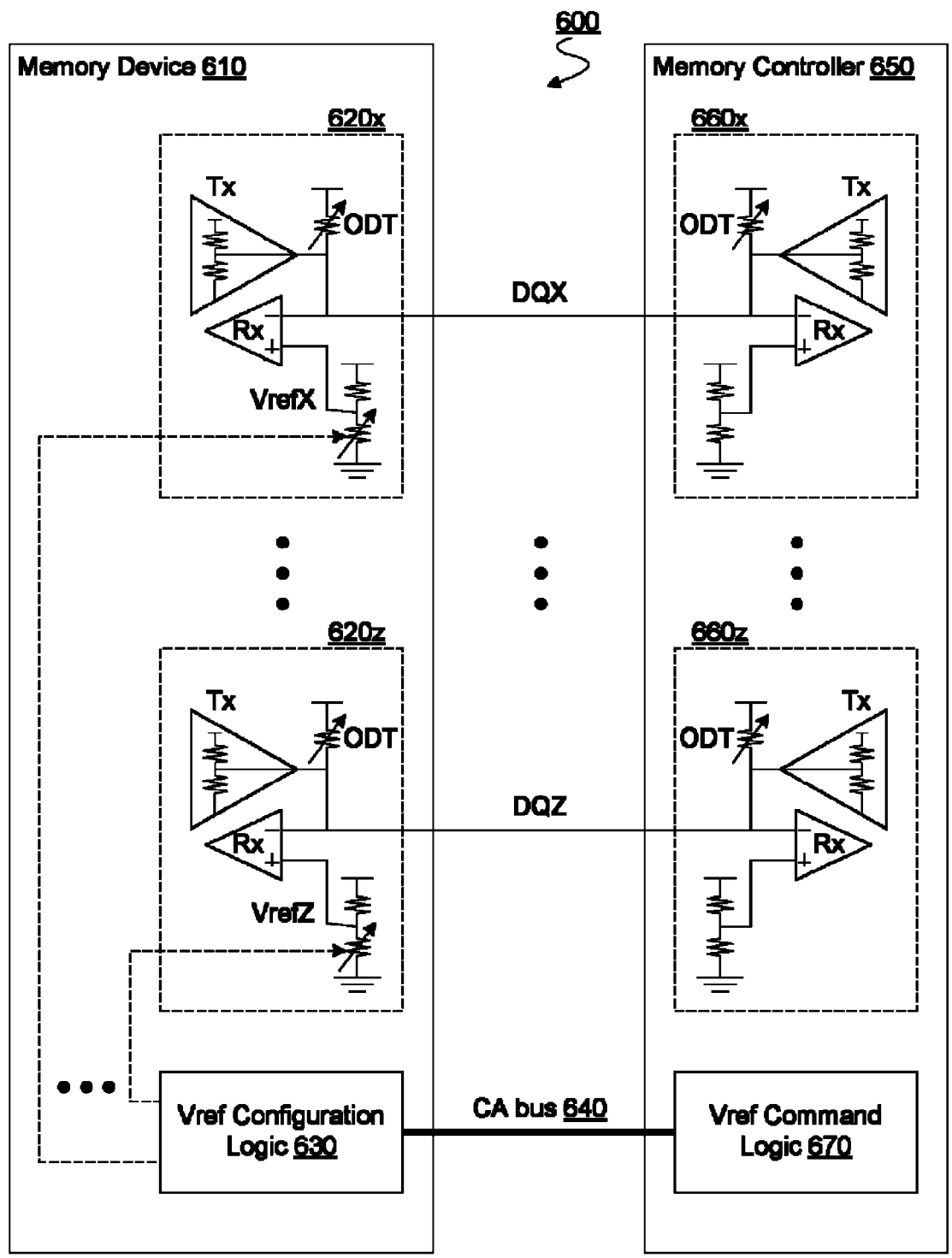
FIG. 6 is a circuit diagram illustrating elements of a system for implementing different reference voltages according to an embodiment.

FIG. 6 illustrates elements of system 600 according to an embodiment for communicating information based on different reference voltage. System 600 may include some or all of the features of system 100, for example. In an embodiment, system 600 includes a memory controller 650 and a memory device 610 coupled thereto via a CA bus 640 and a data bus including signal lines DQX, . . . , DQZ. Memory device 610 and memory controller 650 may provide the respective functionality of memory device 110 and memory controller 120, for example.

Memory controller 650 includes transceiver circuits 660x, . . . , 660z to exchange respective signals with memory device 610 each via a corresponding one of DQX, . . . , DQZ. Similarly, memory device 610 may include transceiver circuits 620x, . . . , 620z each to exchange respective signals with memory controller 650 via a corresponding one of DQX, . . . , DQZ. Some or all of transceiver circuits 620x, . . . , 620z may be variously configurable to process signals exchanged via DQX, . . . , DQZ.

Although certain embodiments are not limited in this regard, some or all of transceiver circuits 620x, . . . , 620z may each include a respective receive differential amplifier Rx and a respective variable voltage divider coupled thereto. Some or all such variable voltage dividers may be operated independent of one another to provide reference voltage levels each to a different respective receive differential amplifier Rx of transceiver circuits 620x, . . . , 620z. For example, Vref command logic 670 of memory controller 650 may send via CA bus 640 one or more configuration commands to Vref configuration logic 630 of memory device 610. In an alternate embodiment, Vref configuration information may instead be exchanged via the data bus—e.g. during a low speed data mode of memory device 610. The one or more configuration commands may specify or otherwise indicate different reference voltage levels for respective ones of transceiver circuits 620x, . . . , 620z. Based on the one or more configuration commands, Vref configuration logic 630 may output signals to adjust the variable voltage dividers of transceiver circuits 620x, . . . , 620z.

FIG. 7 shows tables 700, 710 variously describing a relationship of mode register values each to a corresponding reference voltage level according to an embodiment. Information such as that represented in tables 700, 710 may be included in or otherwise accessed by a memory device for determining adjustments to be made to reference voltage levels for different data bus signal lines. By way of illustration and not limitation, configuration logic 340 may include memory to store tables 700, 710 for reference in response to a memory controller writing configuration values to one or more mode registers. In table 700, mode register bit A6 is used to select one of a plurality of ranges—e.g. including a Range1 and a Range2. Particular values within the range indicated by bit A6 may be identified by mode register bits AO through A5. In this example, different sets of seven (7) bits of Vref configuration information may be provided each for configuring a respective one of multiple receiver circuits of the memory device I/O.

Figure 8:
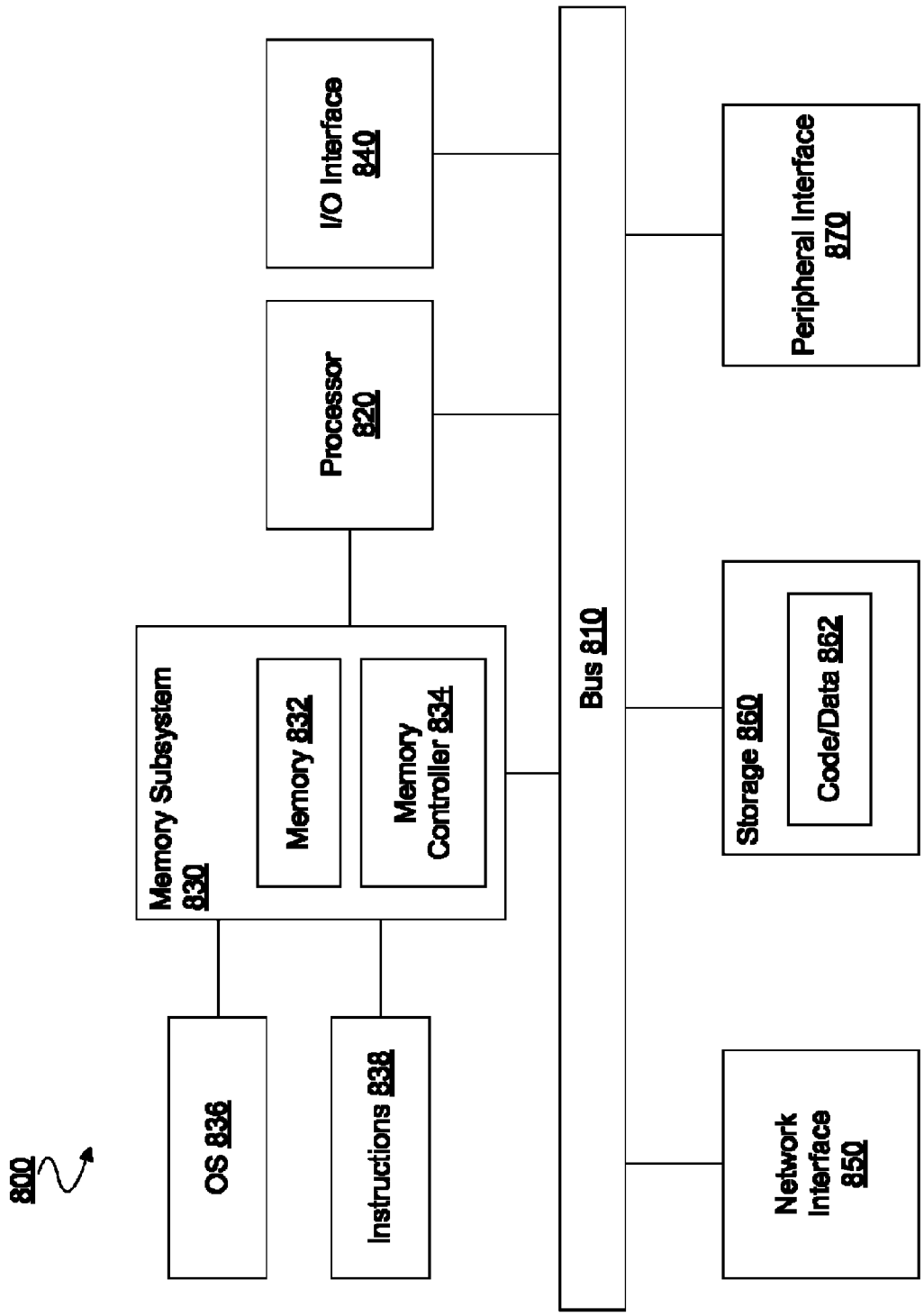
FIG. 8 is a block diagram illustrating elements of a computing system for configuring reference voltages according to an embodiment.

FIG. 8 is a block diagram of an embodiment of a computing system in which different reference voltages for evaluating signals of a bus may be implemented. System 800 represents a computing device in accordance with any embodiment described herein, and may be a laptop computer, a desktop computer, a server, a gaming or entertainment control system, a scanner, copier, printer, or other electronic device. System 800 may include processor 820, which provides processing, operation management, and execution of instructions for system 800. Processor 820 may include any type of microprocessor, central processing unit (CPU), processing core, or other processing hardware to provide processing for system 800. Processor 820 controls the overall operation of system 800, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 830 represents the main memory of system 800, and provides temporary storage for code to be executed by processor 820, or data values to be used in executing a routine. Memory subsystem 830 may include one or more memory devices such as read-only memory (ROM), flash memory, one or more varieties of random access memory (RAM), or other memory devices, or a combination of such devices. Memory subsystem 830 stores and hosts, among other things, operating system (OS) 836 to provide a software platform for execution of instructions in system 800. Additionally, other instructions 838 are stored and executed from memory subsystem 830 to provide the logic and the processing of system 800. OS 836 and instructions 838 are executed by processor 820.

Memory subsystem 830 may include memory device 832 where it stores data, instructions, programs, or other items. In one embodiment, memory subsystem includes memory controller 834, which is a memory controller in accordance with any embodiment described herein, and which provides mechanisms for configuring different reference voltage levels of memory device 832. In one embodiment, memory controller 834 provides commands to memory device 832. The commands may be for memory device 832 to variously configure different reference voltage levels each for respective I/O receiver circuitry of memory device 832.

Processor 820 and memory subsystem 830 are coupled to bus/bus system 810. Bus 810 is an abstraction that represents any one or more separate physical buses, communication lines/interfaces, and/or point-to-point connections, connected by appropriate bridges, adapters, and/or controllers. Therefore, bus 810 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 810 may also correspond to interfaces in network interface 850.

System 800 may also include one or more input/output (I/O) interface(s) 840, network interface 850, one or more internal mass storage device(s) 860, and peripheral interface 870 coupled to bus 810. I/O interface 840 may include one or more interface components through which a user interacts with system 800 (e.g., video, audio, and/or alphanumeric interfacing). Network interface 850 provides system 800 the ability to communicate with remote devices (e.g., servers, other computing devices) over one or more networks. Network interface 850 may include an Ethernet adapter, wireless interconnection components, USB (universal serial bus), or other wired or wireless standards-based or proprietary interfaces.

Storage 860 may be or include any conventional medium for storing large amounts of data in a nonvolatile manner, such as one or more magnetic, solid state, or optical based disks, or a combination. Storage 860 holds code or instructions and data 862 in a persistent state (i.e., the value is retained despite interruption of power to system 800). Storage 860 may be generically considered to be a "memory," although memory 830 is the executing or operating memory to provide instructions to processor 820. Whereas storage 860 is nonvolatile, memory 830 may include volatile memory (i.e., the value or state of the data is indeterminate if power is interrupted to system 800).

Peripheral interface 870 may include any hardware interface not specifically mentioned above. Peripherals refer generally to devices that connect dependently to system 800. A dependent connection is one where system 800 provides the software and/or hardware platform on which operation executes, and with which a user interacts.

Figure 9:
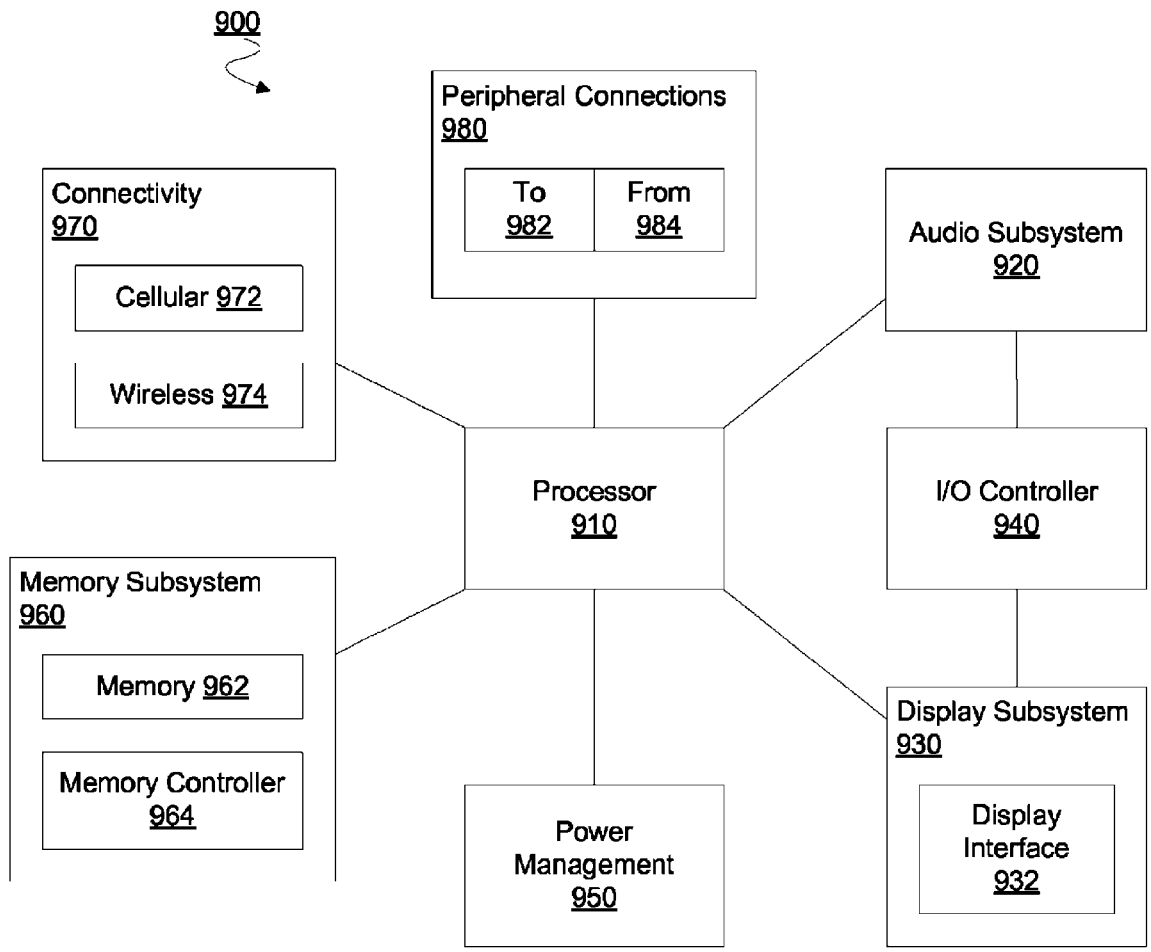
FIG. 9 is a block diagram illustrating elements of a mobile device for configuring reference voltages according to an embodiment.

FIG. 9 is a block diagram of an embodiment of a mobile device in which different reference voltage levels may be implemented—e.g. on a per-bit basis. Device 900 represents a mobile computing device, such as a computing tablet, a mobile phone or smartphone, a wireless-enabled e-reader, or other mobile device. It will be understood that certain of the components are shown generally, and not all components of such a device are shown in device 900.

Device 900 may include processor 910, which performs the primary processing operations of device 900. Processor 910 may include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting device 900 to another device. The processing operations may also include operations related to audio I/O and/or display I/O.

In one embodiment, device 900 includes audio subsystem 920, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 900, or connected to device 900. In one embodiment, a user interacts with device 900 by providing audio commands that are received and processed by processor 910.

Display subsystem 930 represents hardware (e.g., display devices) and software (e.g., drivers) components that provide a visual and/or tactile display for a user to interact with the computing device. Display subsystem 930 may include display interface 932, which may include the particular screen or hardware device used to provide a display to a user. In one embodiment, display interface 932 includes logic separate from processor 910 to perform at least some processing related to the display. In one embodiment, display subsystem 930 includes a touchscreen device that provides both output and input to a user.

I/O controller 940 represents hardware devices and software components related to interaction with a user. I/O controller 940 may operate to manage hardware that is part of audio subsystem 920 and/or display subsystem 930. Additionally, I/O controller 940 illustrates a connection point for additional devices that connect to device 900 through which a user might interact with the system. For example, devices that may be attached to device 900 might include microphone devices, speaker or stereo systems, video systems or other display device, keyboard or keypad devices, or other I/O devices for use with specific applications such as card readers or other devices.

As mentioned above, I/O controller 940 may interact with audio subsystem 920 and/or display subsystem 930. For example, input through a microphone or other audio device may provide input or commands for one or more applications or functions of device 900. Additionally, audio output may be provided instead of or in addition to display output. In another example, if display subsystem includes a touchscreen, the display device also acts as an input device, which may be at least partially managed by I/O controller 940. There may also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that may be included in device 900. The input may be part of direct user interaction, as well as providing environmental input to the system to influence its operations (such as filtering for noise, adjusting displays for brightness detection, applying a flash for a camera, or other features).

In one embodiment, device 900 includes power management 950 that manages battery power usage, charging of the battery, and features related to power saving operation. Memory subsystem 960 may include memory device(s) 962 for storing information in device 900. Memory subsystem 960 may include nonvolatile (state does not change if power to the memory device is interrupted) and/or volatile (state is indeterminate if power to the memory device is interrupted) memory devices. Memory subsystem 960 may store application data, user data, music, photos, documents, or other data, as well as system data (whether long-term or temporary) related to the execution of the applications and functions of device 900.

In one embodiment, memory subsystem 960 includes memory controller 964 (which could also be considered part of the control of device 900, and could potentially be considered part of processor 910). Memory controller 964 monitors voltage swing characteristics of a bus. For example, memory controller 964 may detect different voltage swing characteristics for different signal lines of the same bus—e.g. a data bus. In an embodiment, memory controller 964 issues commands for memory device 962 to configure different reference voltage levels each for a different one or more signal lines of the bus.

Connectivity 970 may include hardware devices (e.g., wireless and/or wired connectors and communication hardware) and software components (e.g., drivers, protocol stacks) to enable device 900 to communicate with external devices. The device could be separate devices, such as other computing devices, wireless access points or base stations, as well as peripherals such as headsets, printers, or other devices.

Connectivity 970 may include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading and/or uploading, changing, synchronizing) content on device 900. Additionally, a docking connector may allow device 900 to connect to certain peripherals that allow device 900 to control content output, for example, to audiovisual or other systems.

In addition to a proprietary docking connector or other proprietary connection hardware, device 900 may make peripheral connections 980 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one implementation, a method at a memory device comprises receiving from a memory controller coupled to the memory device one or more configuration commands indicating a first reference voltage level and a second reference voltage level other than the first reference voltage. The method further comprises, in response to the one or more configuration commands, configuring a first receiver circuit of an input/output (IO) interface to process a first signal based on the first reference voltage level, and configuring a second receiver circuit of the IO interface to process a second signal based on the second reference voltage level. The method further comprises concurrently receiving the first signal and the second signal at the IO interface, wherein the first signal is received via a first signal line of a data bus and the second signal is received via a second signal line of the data bus.

In an embodiment, configuring the first receiver circuit includes adjusting a variable voltage divider of the first receiver circuit. In another embodiment, the variable voltage divider receives a baseline reference voltage, the variable voltage divider to apply a trim to the baseline reference voltage. In another embodiment, wherein the variable voltage divider receives a supply voltage.

In another embodiment, different respective reference voltage levels are configured for each receiver circuit of the IO interface. In another embodiment, the first receiver circuit and the second receiver circuit correspond to different respective bits of a first long word. In another embodiment, the first receiver circuit and the second receiver circuit correspond to different respective bits of a first word. In another embodiment, the first receiver circuit and the second receiver circuit correspond to different respective bits of a first byte. In another embodiment, the first receiver circuit and the second receiver circuit correspond to different respective bits of a first nibble.

In another embodiment, the IO interface further comprises a third receiver circuit, wherein the configuration logic is further to configure the third receiver circuit to process a third signal based on a third reference voltage level, the third signal concurrent with the first signal and the second signal. In another embodiment, the first receive logic includes a first differential amplifier and a first voltage divider circuit coupled to an input of the first differential amplifier and wherein the configuration logic to configure the first receive logic for the processing of the first received data signal includes the configuration logic to adjust a load of the first voltage divider circuit. In another embodiment, further comprises a mode register to store a value indicating a voltage swing value in a range of voltage swing values. In another embodiment, the mode register further comprises one or more bits to store a value specifying a selection of the range of voltage swing values from among a plurality of ranges of voltage swing values.

In another implementation, a memory device comprises an input/output (IO) interface to couple the memory device to memory controller via a data bus, the IO interface to receive via a first signal line of the data bus a first signal and to receive via a second signal line of the data bus a second signal concurrent with the first signal. The IO interface includes a first receiver circuit to process the first signal, and a second receiver circuit to process the second signal. The I/O interface is further to receive from the memory controller one or more configuration commands indicating a first reference voltage level and a second reference voltage level other than the first reference voltage. The memory device further comprises configuration logic responsive to the one or more configuration commands to configure the first receiver circuit based on the first reference voltage level and further to configure the second receiver circuit based on the second reference voltage level.

In an embodiment, the configuration logic to configure the first receiver circuit includes the configuration logic to adjust a variable voltage divider of the first receiver circuit. In another embodiment, the variable voltage divider is to receive a baseline reference voltage and to apply a trim to the baseline reference voltage. In another embodiment, the variable voltage divider is to receive a supply voltage.

In another embodiment, the configuration logic is to configure different respective reference voltage levels for each receiver circuit of the IO interface. In another embodiment, the first receiver circuit and the second receiver circuit correspond to different respective bits of a first long word. In another embodiment, the first receiver circuit and the second receiver circuit correspond to different respective bits of a first word. In another embodiment, the first receiver circuit and the second receiver circuit correspond to different respective bits of a first byte. In another embodiment, the first receiver circuit and the second receiver circuit correspond to different respective bits of a first nibble.

In another embodiment, the IO interface further comprises a third receiver circuit, wherein the configuration logic is further to configure the third receiver circuit to process a third signal based on a third reference voltage level, the third signal concurrent with the first signal and the second signal. In another embodiment, the first receive logic includes a first differential amplifier and a first voltage divider circuit coupled to an input of the first differential amplifier and wherein the configuration logic to configure the first receive logic for the processing of the first received data signal includes the configuration logic to adjust a load of the first voltage divider circuit. In another embodiment, further comprises a mode register to store a value indicating a voltage swing value in a range of voltage swing values. In another embodiment, the mode register further comprises one or more bits to store a value specifying a selection of the range of voltage swing values from among a plurality of ranges of voltage swing values.

In another implementation, a method at a memory controller comprises evaluating a first voltage swing characteristic corresponding to a first signal line of a data bus, evaluating a second voltage swing characteristic corresponding to a second signal line of the data bus, and sending from the memory controller one or more configuration commands indicating a first reference voltage level based on the first voltage swing characteristic and a second reference voltage level based on the second voltage swing characteristic. In response to the one or more commands, a memory device coupled to the memory controller processes a first signal based on the first reference voltage level and further processes a second signal based on the second reference voltage level. The method further comprises concurrently sending to the memory device the first signal via the first signal line and the second signal via the second signal line.

In an embodiment, the memory device configures for each signal line of the data bus a different respective reference voltage level. In another embodiment, the first signal line and the second signal line correspond to different respective bits of a first long word. In another embodiment, the first signal line and the second signal line correspond to different respective bits of a first word. In another embodiment, the first signal line and the second signal line correspond to different respective bits of a first byte. In another embodiment, the first signal line and the second signal line correspond to different respective bits of a first nibble. In another embodiment, the one or more configuration commands write to a mode register of the memory device a value indicating a voltage swing value in a range of voltage swing values. In another embodiment, the one or more configuration commands write to the mode register a value specifying a selection of the range of voltage swing values from among a plurality of ranges of voltage swing values.

In another implementation, a memory controller comprises detect logic to evaluate a first voltage swing characteristic corresponding to a first signal line of a data bus, the detection logic further to evaluate a second voltage swing characteristic corresponding to a second signal line of the data bus. The memory controller further comprises command logic to send from the memory controller one or more configuration commands indicating a first reference voltage level based on the first voltage swing characteristic and a second reference voltage level based on the second voltage swing characteristic. In response to the one or more commands, a memory device coupled to the memory controller processes a first signal based on the first reference voltage level and further configured processes a second signal based on the second reference voltage level, wherein the memory controller is to concurrently send to the memory device the first signal via the first signal line and the second signal via the second signal line.

In another embodiment, the memory device configures for each signal line of the data bus a different respective reference voltage level. In another embodiment, the first signal line and the second signal line correspond to different respective bits of a first long word. In another embodiment, the first signal line and the second signal line correspond to different respective bits of a first word. In another embodiment, the first signal line and the second signal line correspond to different respective bits of a first byte. In another embodiment, the first signal line and the second signal line correspond to different respective bits of a first nibble. In another embodiment, the one or more configuration commands write to a mode register of the memory device a value indicating a voltage swing value in a range of voltage swing values. In another embodiment, the one or more configuration commands write to the mode register a value specifying a selection of the range of voltage swing values from among a plurality of ranges of voltage swing values.

Techniques and architectures for operating a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A memory device comprising:
   an input/output (I/O) interface to couple the memory device to a memory controller via a data bus, the I/O interface to receive via a first signal line of the data bus a first signal and to receive via a second signal line of the data bus a second signal concurrent with the first signal, the I/O interface including:
   a first receiver circuit to process the first signal; and
   a second receiver circuit to process the second signal;
   the I/O interface further to receive from the memory controller one or more configuration commands indicating a first reference voltage level and a second reference voltage level other than the first reference voltage; and
   configuration logic responsive to the one or more configuration commands to configure the first receiver circuit based on the first reference voltage level and further to configure the second receiver circuit based on the second reference voltage level, wherein the configuration logic to configure the first receiver circuit includes the configuration logic to adjust a variable voltage divider of the first receiver circuit.

2. The memory device of claim 1, wherein the variable voltage divider to receive a baseline reference voltage and to apply a trim to the baseline reference voltage.

3. The memory device of claim 1, wherein the variable voltage divider to receive a supply voltage.

4. The memory device of claim 1, wherein the configuration logic to configure different respective reference voltage levels for each receiver circuit of the I/O interface.

5. The memory device of claim 1, wherein the first receiver circuit and the second receiver circuit correspond to different respective bits of a first byte.

6. The memory device of claim 1, wherein the first receiver circuit and the second receiver circuit correspond to different respective bits of a first nibble.

7. The memory device of claim 1, wherein the first receiver circuit includes a first differential amplifier and a first voltage divider circuit coupled to an input of the first differential amplifier and wherein the configuration logic to configure the first receiver circuit includes the configuration logic to adjust a load of the first voltage divider circuit.

8. The memory device of claim 1, further comprising a mode register to store a value indicating a voltage swing value in a range of voltage swing values.

9. The memory device of claim 8, the mode register further comprising one or more bits to store a value specifying a selection of the range of voltage swing values from among a plurality of ranges of voltage swing values.

10. A memory controller comprising:
    detect logic to evaluate a first voltage swing characteristic corresponding to a first signal line of a data bus, the detection logic further to evaluate a second voltage swing characteristic corresponding to a second signal line of the data bus;
    command logic to send from the memory controller one or more configuration commands indicating a first reference voltage level based on the first voltage swing characteristic and a second reference voltage level based on the second voltage swing characteristic, wherein, in response to the one or more configuration commands, a memory device coupled to the memory controller is configured to process a first signal based on the first reference voltage level and is further configured to process a second signal based on the second reference voltage level, wherein the memory controller is to concurrently send to the memory device the first signal via the first signal line and the second signal via the second signal line.

11. The memory controller of claim 10, wherein the memory device configures for each signal line of the data bus a different respective reference voltage level.

12. The memory controller of claim 10, wherein the first signal line and the second signal line correspond to different respective bits of a first byte.

13. The memory controller of claim 10, wherein the first signal line and the second signal line correspond to different respective bits of a first nibble.

14. The memory controller of claim 10, wherein the one or more configuration commands write to a mode register of the memory device a value indicating a voltage swing value in a range of voltage swing values.

15. The memory controller of claim 14, wherein the one or more configuration commands write to the mode register a value specifying a selection of the range of voltage swing values from among a plurality of ranges of voltage swing values.

16. A method at a memory device, the method comprising:
    receiving from a memory controller coupled to the memory device one or more configuration commands indicating a first reference voltage level and a second reference voltage level other than the first reference voltage;
    in response to the one or more configuration commands:
    configuring a first receiver circuit of an input/output (I/O) interface to process a first signal based on the first reference voltage level, wherein configuring the first receiver circuit includes adjusting a variable voltage divider of the first receiver circuit; and
    configuring a second receiver circuit of the I/O interface to process a second signal based on the second reference voltage level; and
    concurrently receiving the first signal and the second signal at the I/O interface, wherein the first signal is received via a first signal line of a data bus and the second signal is received via a second signal line of the data bus.

17. The method of claim 16, wherein different respective reference voltage levels are configured for each receiver circuit of the I/O interface.

18. The method of claim 16, wherein the first receiver circuit and the second receiver circuit correspond to different respective bits of a first byte.

19. The method of claim 16, wherein the first receiver circuit and the second receiver circuit correspond to different respective bits of a first nibble.

20. A method at a memory controller, the method comprising:
    evaluating a first voltage swing characteristic corresponding to a first signal line of a data bus;
    evaluating a second voltage swing characteristic corresponding to a second signal line of the data bus;
    sending from the memory controller one or more configuration commands indicating a first reference voltage level based on the first voltage swing characteristic and a second reference voltage level based on the second voltage swing characteristic, wherein, in response to the one or more configuration commands, a memory device coupled to the memory controller is configured to process a first signal based on the first reference voltage level and is further configured to process a second signal based on the second reference voltage level; and
    concurrently sending to the memory device the first signal via the first signal line and the second signal via the second signal line.

21. The method of claim 20, wherein the memory device configures for each signal line of the data bus a different respective reference voltage level.

22. The method of claim 20, wherein the first signal line and the second signal line correspond to different respective bits of a first byte.

23. The method of claim 20, wherein the first signal line and the second signal line correspond to different respective bits of a first nibble.

* * * * *